Figure 1:
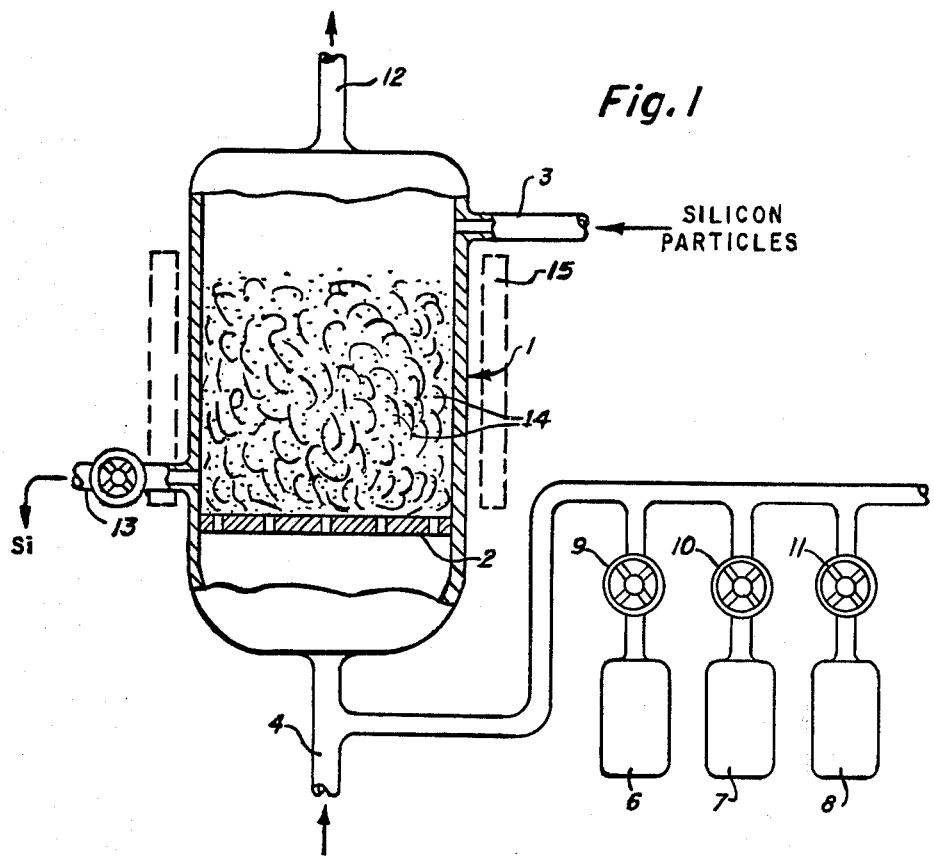

United States Patent [19]

Wakefield

[11] 3,998,659
[45] Dec. 21, 1976

[54] SOLAR CELL WITH SEMICONDUCTOR PARTICLES AND METHOD OF FABRICATION

[75] Inventor: Gene Felix Wakefield, Richardson, Tex.

[73] Assignee: Texas Instruments Incorporated, Dallas, Tex.

[22] Filed: Jan. 28, 1974

[21] Appl. No.: 437,278

[52] U.S. Cl. .............................. 136/89 R; 29/572
[51] Int. Cl.² ................ H01L 31/02; H01L 21/312
[58] Field of Search ...................... 136/89; 29/572

[56] References Cited

UNITED STATES PATENTS

| | | | |
|---|---|---|---|
| 2,537,255 | 1/1951 | Brattain | 136/89 |
| 2,984,775 | 5/1961 | Matlow et al. | 136/89 UX |
| 3,025,335 | 3/1962 | Ralph | 136/89 |
| 3,040,416 | 6/1962 | Matlow et al. | 29/572 |
| 3,134,906 | 5/1964 | Henker | 136/89 UX |
| 3,233,111 | 2/1966 | Pike | 136/89 UX |
| 3,375,418 | 3/1968 | Garnache et al. | 136/89 UX |
| 3,449,705 | 6/1969 | Chamberlin | 136/89 X |
| 3,764,325 | 10/1973 | Te Velde | 136/89 X |

Primary Examiner—Allen B. Curtis
Attorney, Agent, or Firm—Harold Levine; James T. Comfort; Richard L. Donaldson

[57] ABSTRACT

Generally spherical shaped semiconductor particles comprising an inner core of one conductivity type and a thin peripheral layer of opposite conductivity type are produced in a fluidized bed reactor. Silicon particles introduced into the reactor are built up to a desired nominal diameter by vapor deposition from a silicon and dopant containing atmosphere introduced into the reactor; by changing the dopant constituent, the outer peripheral layer is then deposited. One use of such particles is in fabrication of a solar cell, wherein an array of the particles is located on an insulating sheet and overlying conductive layers, insulated from each other, make contact respectively with the peripheral layers and with areas of the core regions, exposed by etching. The particles also may be used to fabricate semiconductor devices, e.g., by use of orientation dependent etches to define flat surfaces on the particles parallel to specific crystallographic planes. Use of other semiconductor materials, e.g., germanium and cadmium slfide also is described.

11 Claims, 5 Drawing Figures

SOLAR CELL WITH SEMICONDUCTOR PARTICLES AND METHOD OF FABRICATION

This invention relates to production of semiconductor material and in particular to production of semiconductor particles of generally spherical shape. The invention relates further to methods of producing semiconductor devices utilizing such particles and to novel semiconductor devices produced by such processes.

Conventionally, semiconductor device manufacture involves purification and preparation of polycrystalline semiconductor material, its processing into rods whch are subsequently refined into monocrystalline semiconductor material and doped with impurities to achieve specific electrical properties. These doped rods are cut into slices which then are mechanically and chemically polished. In a simple manufacturing process, e.g. for production of semiconductor diodes, the slices may typically be subjected to a diffusion process to convert a surface or selected portions of a surface of the slice to opposite conductivity type from the remainder of the slice. At this point, the slice is ready for further processing steps including provision of metal contacts and separation of the slice into individual chips or wafers from which the final semiconductor devices are produced. Such a process while commercially practicable, does involve wastage of a significant ($\sim 85\%$) amount of semiconductor material by the time the individual polished slices are obtained and even further wastage before the individual chips or wafers are obtained.

It has also been proposed to form elemental, high purity semiconductor material in particulate form ready for melting and growing into single crystalline material. However, such a process still requires that the resultant single crystalline material, in rod form, be sliced and polished etc. as described above, and significant material wastage would still be involved.

It is an object of the present invention to provide polycrystalline or monocrystalline semiconductor material in particulate form suitable for direct utilization in production of semiconductor devices without the necessity of intermediate process steps such as crystal growing, slicing and slice polishing.

According to one aspect of the present invention, there is provided a process for producing semiconductor material in particulate form, preferably generally spherical monocrystalline particles. A fluidized suspension of semiconductor particles is formed and maintained at a suitably elevated reaction temperature. A semiconductor-containing vapor together with a dopant vapor of one conductivity type and a vaporized reduction agent are introduced into the fluidized suspension to effect deposition of elemental semiconductor material doped to said one conductivity type onto the elemental semiconductor particles. After a preselected deposition period, the dopant vapor source of one conductivity type is changed to a dopant vapor source of opposite conductivity type so that a layer of semiconductor material doped to said opposite conductivity type is deposited on the particles. A preferred size for the semiconductor particles introduced into the fluidized suspension is in the range 150–350 microns nominal diameter; it is further preferred to deposit a layer of said one conductivity type having a thickness in the range 250–2250 microns on these particles. As a result, particles of semiconductor material are obtained having a generally spherical shape and comprising an inner region of one conductivity type and an outer covering or layer of said opposite conductivity type with a p-n junction therebetween. An advantage of this process is that the semiconductor particles are formed and doped with desired conductivity types in a continuous set of process steps without having to be removed from the fluidized zone in which the necessary reactions take place. Consequently, significant manufacturing economics can be realized not only from the point of view of improved throughput time but also to considerable reduction in material wastage since the doped particles obtained as a result of the process are directly suitable for processing into semiconductor devices and steps such as crystal growing, slicing and polishing of slices and breakage of slices into chips are eliminated. As a result of a process according to the invention, considerably higher device yields than presently obtainable by the above-described conventional process techniques are made feasible. Because the particles produced by a process according to the invention can be pre-sorted by size and shape for a desired end use, they are readily adaptable to completely automated processing further permitting large quantity, low cost semiconductor device production.

Figure 2:
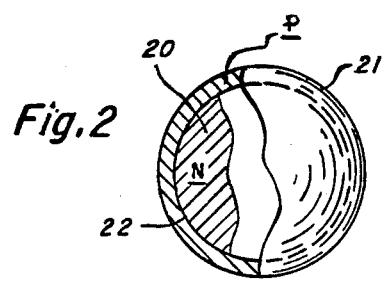
Figure 3A:
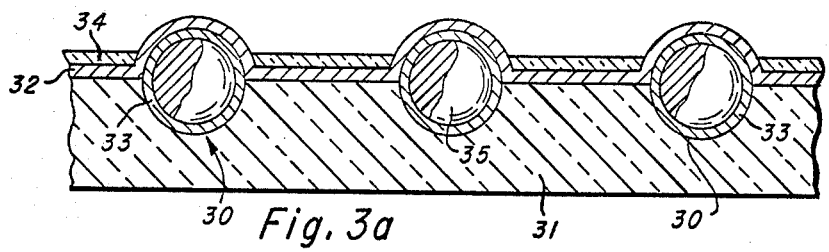
Figure 3B:
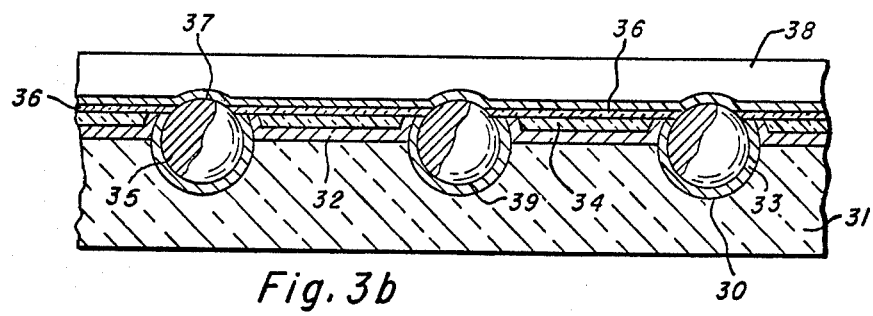
Figure 3C:
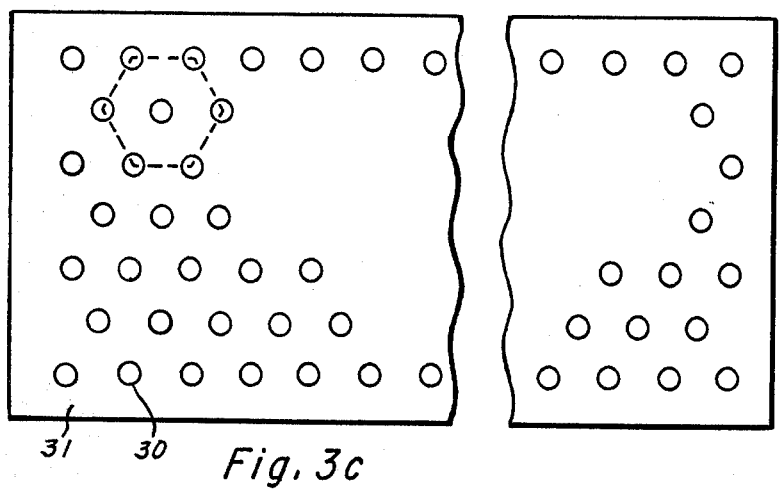

By way of example, the invention will now be described in greater detail with reference to the drawings from which description further objects and advantages of the invention will become apparent. In the drawings:

FIG. 1 is a schematic section of a fluidized bed reactor suitable for producing generally spherical semiconductor particles in accordance with the invention, FIG. 2 is a schematic, typical cross-section (not to scale) of a semiconductor particle produced according to the invention, and FIGS. 3a and 3b are enlarged schematic sections (not to scale) during different stages of manufacture of a solar cell incorporating semiconductor particles produced according to the invention; and FIG. 3c is a top plan view (not to scale) of a completed solar cell produced according to the invention and showing the arrangement of the semiconductor particles.

Apparatus suitable for use in carrying out a process for producing semiconductor particles in accordance with the present invention is schematically illustrated in FIG. 1 and comprises a cylindrical corrosion resistant reactor vessel 1 of high purity quartz or fused silica having a quartz distribution plate 2 located towards the bottom thereof. In relation to the embodiment being described, the reactor suitably has a diameter of 75mm. The reaction vessel 1 includes an inlet 3, located at the upper end of the vessel, for introducing elemental semiconductor particles into the reactor, and an inlet 4 through which a reducing gas/fluidizing agent and reaction constituents can be admitted into the reactor. The reaction constituents are derived from sources 6, 7 and 8 under control of flow valves 9, 10 and 11 respectively. The sources 6, 7 and 8 comprise, respectively, a source of desired semiconductor containing compound, a source of semiconductor dopant compound of one conductivity type (e.g. N-conductivity type) and a source of dopant compound of opposite conductivity type (e.g. P-type). An outlet vent 12 is connected to the top end of the reactor vessel 1 and a discharge outlet 13 for coated semiconductor particles is located at the bottom of the reactor vessel 1, above the distribution plate 2.

Operation of the apparatus will now be described in relation to the production of n-doped monocrystalline silicon particles having an outer p-doped epitaxial layer. In operation of the apparatus, a desired quantity of high purity monocrystalline elemental silicon particles 14, such as would result from the communition of a monocrystalline silicon rod, of a suitable size, e.g. a diameter within the range 150–350μ nominal diameter, are fed through the inlet 3 to form a bed of silicon particles 14 in the reactor, and a stream of pure hydrogen is introduced through the inlet 4 at a flow rate, suitably within the range 25–50 liters/minute, sufficient to fluidize the silicon particles 14 causing the bed to be significantly expanded in volume and the particles 14 to assume a very agitated motion. The fluidized bed is heated by the heater 15 within the range 950°–1250° C sufficient to permit gaseous phase deposition of silicon on the silicon particles 14.

In order to carry out such deposition, a suitable silicon containing compound, $SiCl_4$, $SiHCl_3$, $SiH_2Cl_2$, $SiH_4$, and an n-type doping compound e.g. phosphine, arsine, stibine, are fed from the sources 6 and 8 under control of valves 9 and 11 respectively and introduced through inlet 5 into the reactor 1 in a vaporized state. Valves 9 and 11 are set to give concentrations of the silicon compound and of the dopant of about 12–15% and 0.001–0.01%, respectively in the total hydrogen flow. There ensues a chemical reaction between the vaporized compounds entering through inlet 5 and some of the hydrogen introduced through the inlet 4 resulting in deposition of n-doped silicon on the silicon particles 14 in the fluidized bed, the agitated motion of the silicon particles 14 in the fluidized bed facilitating such deposition over the whole surface areas of the particles. In general, a deposited n-type layer in the thickness range 50–2500μ is suitable. Typically, the n-doped silicon has a doping level of $10^{15}$–$10^{18}$ atoms/cc. After deposition for a time sufficient to build up the particles to a desired size range e.g. 650–850μ the reaction is changed to effect deposition of a p-doped silicon epitaxial layer onto the particles 14 by closing the flow valve 11 and opening the flow valve 10 to introduce a p-type compound vapor e.g. borane or boron trichloride into the reactor through inlet 5, again suitably at a concentration of 0.001–0.01% in the total hydrogen flow. P-type silicon deposition is continued for a time sufficient to build up a desired thickness e.g. 1–10μ p-type surface layer typically having a doping level of $10^{17}$–$10^{20}$ atoms/cc on the silicon particles 14 whereupon such particles may be removed from the reactor vessel 1 through the outlet 13.

During the above-described reactions, excess hydrogen and reaction by-products are exhausted from the reactor vessel 1 through the vent 12.

In addition to silicon, other semiconductor materials suitable for chemical vapor deposition processing — including compound semiconductors — may be used in a process according to the invention, with appropriate adjustment of deposition source material, dopant compounds, flow rates and temperatures.

Particles obtained by the above-described process according to the invention are approximately spherically shaped and have a narrow size range because of the size range of the elemental silicon particles initially introduced into the reactor to provide the fluidized bed. In a specific example, elemental silicon particle size of 250μ nominal diameter may be used, the n-type and p-type depositions producing particles having a nominal overall diameter of 750μ.

The structure of a silicon particle obtained by the above-described process is generally indicated, by way of example, in FIG. 2. The particle has an n-type inner region 20 surrounded by a thin p-type surface layer 21 defining a p-n junction 22, and the particle is seen to be approximately circular in cross-section and has an approximately spherical overall shape. Deposition of the p-type layer 21 results in a much better defined p-n junction 22 and a smoother surface topography, with very few surface imperfections, of the p-type layer 21 as compared with a diffused p-type layer formed in a mechanically produced silicon sphere. Particles having a p-type core surrounded by an n-type surface layer also could be produced, using appropriate changes in impurity dopants.

One particular application of semiconductor spherical particles produced by a process according to the invention will be described by way of example, it being appreciated that other fabrication methods may be employed and other types of semiconductor devices produced.

Large area solar cells are becoming increasingly attractive as electric power sources and the use of semiconductor particles having an approximately spherical shape in construction of solar cells offers a number of advantages since such cells are economic in usage of semiconductor material and have a high light to electricity conversion factor.

The fabrication of one form of such a solar cell will be described with reference to FIGS. 3a to 3c. In spherical particles produced in accordance with the invention for use in solar cells, the p-type epitaxial layer should be sufficiently thin, e.g. 1–10μ that a high proportion of photons generated by incident radiation to give rise to carrier flow across the p-n junction, i.e. only a small proportion of such photons recombine within the epitaxial layer. Silicon spheres 30 of a preselected size (e.g. about 750μ nominal diameter) obtained by a process ad described with reference to FIG. 1, are set in a closely spaced predetermined pattern (for example a hexagonal centered pattern as shown in FIG. 3c) in a thin flexible insulating sheet 31 such as a semipolymerized plastic which, for example, may typically be about 2 meters in length to continuous in length, 1–2 meters wide and 0.1 mm thick.

By way of example, a vacuum head having one or more rows of suction apertures disposed therein in accordance with the required silicon particle and row spacing may be used to position the particles on the sheet, which may be advanced past the vacuum head by a stepping mechanism synchronized with the vacuum head.

The alignment of the spheres is not critical, the primary consideration being adequate coverage of the surface area of the insulating sheet. The spacing between adjacent spheres will depend partly on the nominal diameter of the spheres, on the desirability of ensuring that incident radiation reflected from the surface of one sphere impinges on the surface of an adjacent sphere thereby increasing the conversion efficiency of the overall structure, and of obtaining maximum projected surface area of the spheres to incident solar radiation. Preferably as shown in FIG. 3a after curing (hardening or polymerization) of the insulating sheet 31, conductive layer 32 is then deposited over the surface of the insulating sheet and the exposed p-type layers 33 of the silicon spheres 30 which are set in the sheet, to establish or make a current carrying contact to the p-layers of the spheres. The metal layer 32 may be composed of aluminum conformally deposited to a thickness of about 0.5–1.0μ over the spheres and the insulating layer 31 to closely follow the contours of the silicon spheres and the intervening areas of the insulating layer. Suitably, the aluminum layer 31 may be deposited by evaporation, sputtering or preferably by a chemical vapor depositon process at about 150°–200° C. Alternatively, by using a higher temperature insulating sheet 31, e.g. one made of castable alumina, a conductive layer of tungsten may be formed by reduction of tungsten hexafluoride in the presence of hydrogen at a temperature of about 700° C for a time sufficient to deposit a tungsten layer of a desired thickness, e.g. 0.5–1μ. The deposited tungsten layer 32 is advantageous in that it has very good adherence to silicon, does not readily diffuse into silicon and has excellent abrasion resistance.

An insulating layer 34 (of plastic or castable alumina) is then formed by pouring a liquid that drys, hardens or cures into the insulating layer over the conductive layer 32 between the silicon spheres 30 so that a portion of each of the silicon spheres 30 projects above the insulating layer 34. Following curing of the insulating layer, the areas of the conductive layer 33 on the projecting portions of the silicon spheres are then selectively etched away using hydrofluoric-nitric-acetic (such as '1-3-8' etch) acid etching in which the exposed areas of the p-type layers 33 are removed to expose the n-type inner regions 35 of the silicon spheres. A further insulating layer of plastic or castable alumina 36 is then formed, as shown in FIG. 3b, over the insulating layer 34 to leave a smaller area of the n-type region 35 of each sphere 30 projecting above the layer 36. Following curing of the insulating layer, a further conductor layer 37 is conformally deposited over the exposed areas of the n-type regions 35 and the insulating layer 36, either by evaporation of aluminum or by using a tungsten deposition process as described above, to form current carrying interconnections between the n-type regions 35 of the spheres 30. A further translucent insulating layer 38 may then be formed to cover the metal layer 37 for protection from dust and water.

In operation of such a solar cell, light impinging on the exposed n-type areas 35 of the silicon spheres result in the formation of electron-hole pairs at the p-n junctions 39 of the spheres and generation of a corresponding emf between the conductive layers 32 and 37.

Instead of a semi-polymerized plastic, other materials may be used for the insulating layers 31, 34 and 36. For example, a thermoplastic material may be used, initially in a softened (heated) state with subsequent cooling to set the silicon spheres therein; a partly cured epoxy resin also is suitable, curing being completed to locate the silicon spheres. In any event, the insulating layers should not degrade with extended exposure to solar radiation.

Although silicon has been described as a suitable semiconductor material for use in constructing solar cells, the spheres could be fabricated from other semiconductor materials, e.g. cadmium sulphide, suitable for solar cell construction. Additionally, polycrystalline particles could be produced for use in such solar cells if desired. Discrete devices other than solar cells, especially diodes, also may be formed in an economical manner from semiconductor particles produced in accordance with the invention, and again semiconductor materials other than silicon, e.g. germanium, may be used to produce the spheres. Furthermore, the thickness criticality associated with the epitaxial layer in spherical particles for use in solar cells, explained above, does not necessarily apply in use of the spheres to produce other forms of semiconductor devices and accordingly epitaxial layer thicknesses greater than 10μ may be used if necessary. Such devices may be produced on the surfaces of the spherical particles or on a flat obtained by selective removal of a part of the surface area of a sphere. This latter approach can be accomplished conveniently by the use of orientation dependent etches such as those based on $KOH-H_2O$ — Isopropyl alcohol (see, for example, "Anisotropic Etching of Silicon with $KOH-H_2O$ — Isopropyl Alcohol", J. B. Price, *Semiconductor Silicon* 1973, H. R. Huff and R. R. Burgess, Editors, the Electrochemical Society, Princeton N.J. 1973). For instance, 20% by weight KOH in 5% IPA 95% $H_2O$ solution at 80° C. This etch, and others, will transform the spherical shape (or only a portion of the sphere if the particle is only partly immersed in the etch) into a regular shaped polyhedra with flat sides parallel to specific crystallographic planes. Selection of various planes for exposure can be made by judicious selection of the orientation dependent etch. Contacts can be made to the regions of the etched particle using convention metal through oxide techniques.

While the present invention has been described in detail with respect to illustrative embodiments, it will be apparent to those skilled in the art that various changes may be made without departing from the spirit or scope of the present invention.

What is claimed is:

1. A method of manufacturing a solar cell comprising setting a multiplicity of small semiconductor particles into a surface of a first insulating support layer to form a predetermined array of said particles partially embedded in said layer, said semiconductor particles each comprising an inner region of one conductivity type and an outer vapor deposited coating of opposite conductivity type; depositing a layer of conductive material overlying said first insulating layer and conforming to the surface contours of the said opposite conductivity type coatings of said particles; forming a first covering of insulating material over said first conductive layer between said particles to leave portions of said particles projecting from said insulating material; removing areas of said conductive layer and of said coating of opposite conductivity type from said projecting portions of said semiconductor particles to expose areas of said one conductivity type of said particles; forming a further covering of insulating material over said first covering of insulating material to leave smaller areas of said one conductivity type of said particles projecting from said further covering of insulating material; and depositing conductive material on said further covering of insulating material to conform to the surface contours of said smaller areas of said particles to selectively interconnect the said one conductivity type regions of said particles.

2. A method as claimed in claim 1, wherein said semiconductor particles comprise monocrystalline silicon particles having an outer epitaxially deposited coating of 1–10 microns thickness.

3. A method as claimed in claim 1, wherein said areas of said conductive layer and of said coating of opposite conductivity type are removed by a single selective chemical etching step.

4. A method as claimed in claim 1, wherein said conductive material is aluminum.

5. A method as claimed in claim 4, wherein said insulating material is selected from the group comprising partly polymerized plastic, thermoplastic and partly cured epoxy resin.

6. A method as claimed in claim 1, wherein said conformally deposited conductive material is chemically vapor deposited tungsten.

7. A method as claimed in claim 6, wherein said insulating support layer and said insulating material are castable alumina.

8. A solar cell comprising a multiplicity of semiconductor photodiodes comprising semiconductor particles partially embedded in a substantially flat surface of a first support layer of insulating material to form a predetermined array of said particles, said semiconductor particles each comprising an inner region of one conductivity type and an outer epitaxial layer of opposite conductivity type; portions of said semiconductor particles remote from said insulating layer having surface portions thereof removed to expose an area of the inner region surrounded by an area of said outer epitaxial layer; an electrically conductive layer on said insulating layer conforming to the contour of and electrically contacting the outer surfaces of the epitaxial layers of said semiconductor particles and providing a substantially flat surface between said particles; a second insulating material layer overlying said first conductive layer and said areas of said outer epitaxial layers of said particles to selectively expose areas of said regions of one conductivity type of said semiconductor particles, said exposed areas projecting from said third insulating material layer; and a second electrically conductive layer on said second insulating layer conforming to the contours of and selectively interconnecting said exposed areas of said projecting regions of one conductivity type of said semiconductor particles.

9. A solar cell as claimed in claim 8, wherein said insulating material is a plastic material and said conductive layers comprise aluminum.

10. A solar cell as claimed in claim 8, wherein said first insulating support layer is an elongated sheet of flexible plastic material.

11. A solar cell as claimed in claim 8, wherein said insulating material is alumina and said conductive layers comprise chemically vapor deposited tungsten.

* * * * *